(12) United States Patent
Yamada et al.

(10) Patent No.: US 8,283,850 B2
(45) Date of Patent: Oct. 9, 2012

(54) ELECTROLUMINESCENT ELEMENT, LIGHTENING EQUIPMENT, AND DISPLAY DEVICE

(75) Inventors: Yasumi Yamada, Tokyo (JP); Motofumi Kashiwagi, Tokyo (JP)

(73) Assignee: Zeon Corporation, Tokyo (JP)

( * ) Notice: Subject to any disclaimer, the term of this patent is extended or adjusted under 35 U.S.C. 154(b) by 27 days.

(21) Appl. No.: 11/596,679

(22) PCT Filed: May 16, 2005

(86) PCT No.: PCT/JP2005/008879
§ 371 (c)(1),
(2), (4) Date: Nov. 16, 2006

(87) PCT Pub. No.: WO2005/112514
PCT Pub. Date: Nov. 24, 2005

(65) Prior Publication Data
US 2007/0241673 A1    Oct. 18, 2007

(30) Foreign Application Priority Data

May 17, 2004 (JP) ................. 2004-147076
May 17, 2004 (JP) ................. 2004-147078

(51) Int. Cl.
*H01L 51/50* (2006.01)
(52) U.S. Cl. ............................................. 313/504
(58) Field of Classification Search ......... 313/512, 313/504
See application file for complete search history.

(56) References Cited

U.S. PATENT DOCUMENTS

| | | | | |
|---|---|---|---|---|
| 4,471,090 A | * | 9/1984 | Goto et al. ............... | 525/58 |
| 5,021,931 A | * | 6/1991 | Matsui et al. ............. | 362/84 |
| 6,278,546 B1 | * | 8/2001 | Dubin et al. .............. | 359/452 |
| 6,577,358 B1 | * | 6/2003 | Arakawa et al. .......... | 349/57 |
| 6,586,876 B2 | * | 7/2003 | Tsai et al. ................. | 313/509 |

(Continued)

FOREIGN PATENT DOCUMENTS

JP    9-73983 A    3/1997

(Continued)

OTHER PUBLICATIONS

English Translation of JP 2004-039579 A.*

(Continued)

*Primary Examiner* — Anh Mai
*Assistant Examiner* — Hana Featherly
(74) *Attorney, Agent, or Firm* — Birch, Stewart, Kolasch & Birch, LLP

(57) ABSTRACT

There is a huge demand for increase in the luminance of electroluminescent elements and decrease in the electric power consumption. An objective of the present invention is to provide such an electroluminescent element as to satisfy the demand, as well as lightening equipment and display devices with high performance by utilizing the element. Provided is an electroluminescent element comprising a transparent substrate, and a first electrode layer, a light-emitting layer, and a second electrode layer, which layers are layered on the substrate in this order, wherein a surface of the transparent substrate on the side of the first electrode layer has a light-directional structure. A lightening device and a display device including this electroluminescent element are also provided.

14 Claims, 4 Drawing Sheets

U.S. PATENT DOCUMENTS

| | | | |
|---|---|---|---|
| 6,617,784 B1 * | 9/2003 | Abe et al. | 313/506 |
| 6,869,195 B2 * | 3/2005 | Hannington | 359/614 |
| 2002/0118271 A1 * | 8/2002 | Mashimo et al. | 347/241 |
| 2004/0021762 A1 * | 2/2004 | Seki et al. | 347/136 |
| 2004/0046496 A1 | 3/2004 | Mishima | |
| 2004/0189185 A1 | 9/2004 | Yotsuya | |
| 2005/0006999 A1 * | 1/2005 | Minoura et al. | 313/110 |

FOREIGN PATENT DOCUMENTS

| | | | |
|---|---|---|---|
| JP | 10-172756 A | | 6/1998 |
| JP | 11-74072 A | | 3/1999 |
| JP | 2002-006114 A | | 1/2002 |
| JP | 2002-184567 A | | 6/2002 |
| JP | 2003-59641 A | | 2/2003 |
| JP | 2003059641 A | * | 2/2003 |
| JP | 2003-86353 A | | 3/2003 |
| JP | 2004-39579 A | | 2/2004 |
| JP | 2004-79301 A | | 3/2004 |
| JP | 2004-119211 A | | 4/2004 |
| JP | 2004-127661 A | | 4/2004 |
| KR | 2004-071066 A | | 8/2004 |
| WO | WO 03/077325 A1 | | 9/2003 |

OTHER PUBLICATIONS

English Translation of JP 2003/059641 to Sone.*
European Office Action, dated Jun. 14, 2011, for European Application No. 05739318.3.
Korean Office Action, dated Jun. 28, 2011, for Korean Application No. 10-2006-7026510.
Supplementary European Search Report dated Mar. 16, 2011 for European Application No. 05739318.3.
Korean Office Action dated Apr. 30, 2012 for Korean Patent Application No. 2006-7026510.

* cited by examiner

ELECTROLUMINESCENT ELEMENT, LIGHTENING EQUIPMENT, AND DISPLAY DEVICE

TECHNICAL FIELD

The present invention relates to an electroluminescent element, lightening equipment, and a display device, particularly to an electroluminescent element, lightening equipment, and a display device, from which light can be out-coupled at high efficiency.

BACKGROUND ART

A typical electroluminescent element has a planar transparent substrate 1, and a first electrode layer 2, a light-emitting layer 3 and a second electrode layer 4 that are layered in this order on the lower side of the planar transparent substrate 1, as shown in FIG. 11. Upon the application of a voltage between the first electrode layer 2 and the second electrode layer 4, the light-emitting layer 3 generates light. The light generated in the light-emitting layer 3 passes through the first electrode layer 2 and the transparent substrate 1, and is emitted upward. Serious problems associated with effective use of the light generated in the light-emitting layer 3 are the transparency of the first electrode layer 2 and the transparent substrate 1, as well as the reflection loss between the first electrode layer 2 and the transparent substrate 1 and that between the transparent substrate 1 and the outside, which is typically air, of the electroluminescent element. When light is emitted out of the transparent substrate 1 to the outside, some portions of the light is totally reflected at the interface between the transparent substrate 1 and the air due to their difference in refractive index, which lowers the efficiency at which the light generated in the light-emitting layer 3 is emitted outward from the transparent substrate 1 located above the layer 3, or the efficiency at which the light is out-coupled from the element.

Patent Documents 1 and 2 teach the formation of small lens arrays in the interfacial surface of the transparent substrate to improve the efficiency at which the light is out-coupled. They also teach that compared with the case where light rays generated in the light-emitting layer 3 come to a smooth surface of the transparent substrate at various incidence angles and go out thereof, the small lens arrays formed in the surface of the transparent substrate make the incidence angles smaller. The smaller incidence angles, in turn, minimize the reflection loss when the rays are emitted to the outside, and improve the efficiency at which the light is out-coupled.

Patent Document 1: JP 9-73983 (1997), A
Patent Document 2: JP 2003-59641, A

DISCLOSURE OF THE INVENTION

Problems to be Solved by the Invention

On the other hand, there is a huge demand for increase in the luminance of electroluminescent elements and decrease in the electric power consumption. Merely reducing the reflection loss at the interface between the outside and the surface of the transparent substrate contacting the outside does not provide a satisfactory efficiency at which the light is out-coupled, and more increase in the efficiency is demanded.

In view of these situations, an objective of the present invention is to provide an electroluminescent element with a further improved efficiency at which the light is out-coupled.

Another objective of the present invention is to provide lightening equipment and display devices with high luminance and small electric power consumption.

Means to Solve the Problems

As a result of intensive study made by the inventors of the present invention, the importance of reducing the light absorption loss in the transparent substrate, as well as lowering the light reflection loss at the interface between the first electrode layer and the transparent substrate, has been recognized. A further study led to a finding that the aforementioned objectives could be achieved by employing a special structure for the interface between the first electrode layer and the transparent substrate. The present invention was thus completed.

The first invention to solve the problems is an electroluminescent element comprising a transparent substrate, and a first electrode layer, a light-emitting layer and a second electrode layer that are layered on the substrate in this order, wherein a surface of the transparent substrate on the side of the first electrode layer has a light-directional structure. In other words, the electroluminescent element according to the present invention is one with a transparent substrate, the first-electrode-layer-side surface of which has a light-directional structure, such as many minute lenses, or many microlenses, formed therein. The light-directional structure is one capable of reducing the loss due to the total reflection at the first-electrode-layer-side surface of the transparent substrate, and of further transmitting light almost perpendicularly to the transparent substrate, or upward in FIG. 1. The light-directional structure is capable of providing the transmitted light with a directional orientation. The perpendicular transmission from the first electrode layer to the transparent substrate keeps the rays from going into the other surface of the transparent substrate, or the upper outer surface of the electroluminescent element in FIG. 1, at such incidence angles that the rays are totally reflected, which results in a reduction in the reflection loss due to total reflection.

The second invention is the electroluminescent element according to the first invention, wherein the transparent substrate has the light-directional structure in both surfaces thereof. According to the second invention, the light-directional structures, such as microlenses, formed in both surfaces enhance the efficiency at which the light is out-coupled. The structure in the surface contacting the air also provides the rays with a directional control in the same way as that in the surface contacting the first electrode layer, and prevents the rays from total reflection at the interface between the upper surface of the transparent substrate and the air. The performances of both light-directional structures further enhance the efficiency at which the light is out-coupled, as a whole. For the light-directional structure, appropriately used is a microlens array, a structure made of many microlenses. Especially preferable is a structure in which a plurality of microlenses, each with a height of 0.01 to 100 µm, are arranged throughout the length and breadth of the transparent substrate at a pitch of 10 µm to 1 mm.

The third invention is an electroluminescent element according to the first or second invention, wherein the side faces of the transparent substrate are provided with a reflecting structure. The side faces mean the faces of the substrate other than the aforementioned surfaces, or the upper and lower surfaces thereof. In other words, the side faces are faces that define the thickness of the transparent substrate. As shown in FIGS. 6 and 7, the reflecting structure may be any structure as long as the rays radiated from a light source 8 in the light-emitting layer 3 are easily reflected by the side faces with the structure. In the example shown in FIG. 6, which is an embodiment, the side faces have such a shape that a vertical section of each side face gradually bends outward as the height increases. This shape enables the rays to totally reflect off the side faces due to the difference between the refractive index of the transparent substrate and that of the air. In the embodiment shown in FIG. 7, which shows only the transparent substrate, the side faces are so inclined that the area of the horizontal section of the substrate, defined by the side faces, becomes larger with the height from the bottom of the substrate. This shape of the side faces also enables the element to emit more light from the upper surface of the transparent substrate because of the total reflection at the side faces. In addition, the reflecting structure comprising projecting portions and depressed portions or a mirror surface enables the rays to effectively go out of the upper surface of the transparent substrate. FIG. 8 shows an embodiment in which the transparent substrate has side faces with projecting portions and depressed portions. FIG. 9 shows an embodiment in which the side faces of the transparent substrate are provided with a mirror surface.

The fourth invention is the electroluminescent element according to the first invention, wherein the transparent substrate has a water absorption of 0.1% or less and a thermal expansion coefficient of 0 to 80 ppm/K. When the water absorption or the thermal expansion coefficient of the transparent substrate is large, the transparent substrate may expand or contract depending on the conditions where the electroluminescent is used. In the present invention that we have explained, one or both of the surfaces of the transparent substrate are provided with the light-directional structure, such as microlenses. Therefore an expansion or contraction of the substrate will cause distortions in the light-emitting layer and/or the light-directional structure, such as microlenses. The distortions may deform the light-directional structure, which results in a deterioration in the control of the light direction, or a decrease in the efficiency at which the light is out-coupled from the element. The distortions may even break the electroluminescent element in extremely bad cases. Also, if the water absorption is large, there is a probability that the transparent substrate may absorb moisture from the environment where it is used, such as the surrounding air, and the moisture is allowed to permeate through the element to the light-emitting layer. Generally, the light-emitting layer is made of materials that are apt to deteriorate in the presence of moisture. Therefore in order to avoid such deterioration, the transparent substrate should have small water absorption. The present invention is capable of improving the stability of the performance of the electroluminescent element and making its life longer.

The fifth invention is the electroluminescent element according to the first invention, wherein the transparent substrate is made of a resin with an alicyclic structure. Resins with the alicyclic structure generally have excellent properties, such as a low birefringence index as optical material, and small water absorption. Such resins have the properties that were described in the paragraph related to the fourth invention as well. The resins are appropriate for the material of the transparent substrate. They are important for the transparent substrate of a practical electroluminescent element.

The sixth invention is a lightening device with the electroluminescent element according to the first invention.

The seventh invention is a display device with the electroluminescent element according to the first invention, for example a liquid-crystal display device that employs an electroluminescent element according to the first invention for its backlight device. Because the lightening device and the display device utilize the high-performance electroluminescent element of the present invention, they naturally exhibit excellent lightening and displaying functions at low electric power consumption.

Advantages of the Invention

The electroluminescent elements according to the first and second inventions reduce the reflection loss at the interface between the transparent substrate and the first electrode layer, and further the reflection loss between the transparent substrate and the outside of the element. Therefore the electroluminescent elements have very good light out-coupling efficiency. In other words, the electroluminescent elements have high luminance and low electric power consumption. The electroluminescent element according to the third invention has a structure that enables the element to further utilize the rays that leaked from the side faces of the transparent substrate. The fourth and fifth inventions provide electroluminescent elements that have a stable performance and a long life as well as the above-mentioned excellent properties such as the high light out-coupling efficiency. Furthermore, the sixth and seventh inventions provide high-performance lightening devices and display devices utilizing the high-performance electroluminescent element explained above.

EXPLANATION OF REFERENCE NUMERALS

1 . . . transparent substrate; 2 . . . the first electrode layer; 3 . . . light-emitting layer; 4 . . . the second electrode layer; 5-1 . . . light-directional structure formed in the first-electrode-layer-side surface; 5-2 . . . light-directional structure formed in the surface of the electroluminescent element that contacts the outside; 6 . . . light-directional structure; 7 . . . mirror (made of a substance with metallic luster, such as aluminum foil); 8 . . . light source; 9 . . . a top view of microlenses, only four of which are shown in the figure, that comprise the light-directional structure formed in the first-electrode-layer-side surface of the substrate; 10 . . . a top view of microlenses, only four of which are shown in the figure, that comprise the light-directional structure formed in the surface of the electroluminescent element that faces the outside; 11 . . . a pitch at which the microlenses are arranged in the light-directional structure; 1$a$, 1$d$ . . . rays totally reflected at the side faces of the transparent substrate.

BEST MODE TO CARRY OUT THE INVENTION

Figure 1:
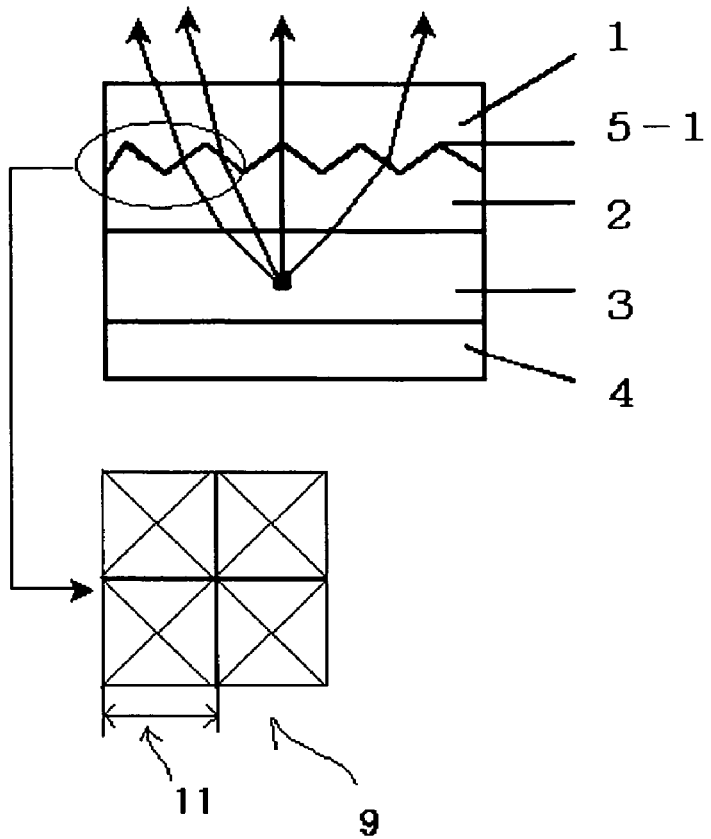
FIG. 1 is a diagram illustrating the structure of an electroluminescent element according to the present invention, which is also described Working Example 1. Shown in the lower part is an enlarged view of a part of the light-directional structure.

We are going to describe in detail embodiments preferable to carry out the invention, referring to the attached figures, with emphasis on FIG. 1. Needless to say, the embodiments described hereinafter are preferable examples of the present invention, and they include various technically preferable limitations. The scope of the invention is not limited to those embodiments with such limitations unless there is an explicit statement that the limitations are essential to the present invention.

FIG. 1 shows the features of the first embodiment of the electroluminescent element according to the present invention. The electroluminescent element in FIG. 1 comprises a transparent substrate 1, and a first electrode layer 2, a light-emitting layer 3 and a second electrode layer 4 that are layered on the lower surface of the substrate 1 one by one in this order. The transparent substrate 1 is a light transmitting plate in the shape of a square or a rectangular. A light-directional structure 5-1 is formed in the surface of the transparent substrate 1, which surface is in contact with the first electrode layer 2. The light-directional structure 5-1 is a structure comprising many arranged elements each with a heightened portion and a lowered portion, which is sometimes called microlens, such as a minute conical lens, a polygonal pyramid-shaped lens, e.g. a triangular pyramid-shaped lens or a quadrangular pyramid-shaped lens, or a domed lens. When the light-directional structure 5-1 exists at the interface between the first electrode layer 2, a layer with a large refractive index, and the transparent substrate, a layer with a relatively smaller refractive index, the structure is capable of reducing the reflection loss due to the total reflection that may occur as rays coming from the large refractive index layer into the interface with various incidence angles, or scattered light rays, travel to the small reflective index layer. The structure is also capable of setting the scattered light rays to rays with a directional orientation and sending the latter to the transparent substrate 1, which leads to an improvement in the efficiency at which the light rays are sent from the first electrode layer 2 to the transparent substrate 1.

Although it is theoretically possible to constitute the structure with, for example, a single quadrangular pyramid-shaped lens, a structure made by arranging many minute microlenses with the shape of, for example, a quadrangular pyramid, in the surface of the transparent substrate 1 is preferable. Generally, electroluminescent elements with a thickness as small as possible are preferable. Also, in order to improve the efficiency at which the light is out-coupled from the electroluminescent element as a whole, it is necessary that the entire surface of the transparent substrate 1 have the above-mentioned effects. To satisfy both requirements, a structure made of many microlenses arranged in the entire surface of the transparent substrate 1, which surface is in contact with the first electrode layer 2, is preferable. The arranged microlenses are sometimes called "microlens array". The microlenses may be either recessed or protruding in relation to the transparent substrate 1.

The layers lower than the first electrode layer 2 may be the same as those of the conventional electroluminescent element. Specifically, the first electrode layer 2, the light-emitting layer 3, and the second electrode layer 4 are layered downwardly in this order on the transparent substrate 1. The first electrode layer 2 is a transparent electrode made of materials such as indium zinc oxide, which is often called "IZO", or indium tin oxide, which is often called "ITO". The light-emitting layer 3 is a laminate made of an allylamine material such as TPD and an aluminum complex such as $Alq_3$, or a single layer or a laminate made of an inorganic compound such as ZnS or an organic compound such as $Alq_3$. The second electrode layer 4 is also called "back side electrode" and made of, for example, an evaporated film of aluminum. Upon the application of a voltage between the first electrode layer 2 and the second electrode layer 4, the light-emitting layer 3 generates light by electroluminescent effect. The generated light, as well as the light reflected by the second electrode layer 4, passes through the first electrode layer 2, the light-directional structure 5 and the transparent substrate 1, and goes outside the electroluminescent element.

In the present invention, the constructions and mechanisms of the first electrode layer 2, the light-directional structure 5, and the transparent substrate 1 through which the light passes are important. We are going to explain them in detail. The thickness of the transparent substrate 1 is typically from 0.03 to 10 mm, preferably from 0.1 to 3 mm. Although the unevenness due to the heightened and lowered portions in the surface of the transparent substrate can usually be ignored, it will be acceptable if the thickness at the lowered portions is within the aforementioned range. For the transparent substrate 1 has been used a transparent inorganic material, such as glass, from the viewpoint of strength and gas-barrier property. However, in order to obtain a thin and flexible electroluminescent element, thin and flexible resins are suitable for the material of the transparent substrate. Among them, the resins with alicyclic structures excellent in light transmission, heat stability, water absorption properties, mechanical properties, etc. are an appropriate material. The resins may have the alicyclic structures either in their main chain or in their side chains. Examples of the alicyclic structure include cycloalkanes and cycloalkenes. Cycloalkanes are preferable from the viewpoint of heat stability. The number of carbon atoms comprising the alicyclic structure is typically from 4 to 30, preferably from 5 to 20, more preferably from 5 to 15. When the number of carbon atoms is within the above-mentioned range, a resin with excellent heat resistance and flexibility can be obtained. The proportion of the repeating units with an alicyclic structure in a resin should be decided appropriately depending on the purpose of its use.

Specific examples of the resin with the alicyclic structures may include a norbornene polymer, a polymer of a cycloolefin with a single ring, a polymer of a cyclic conjugated diene, a polymer of a vinyl alicyclic hydrocarbon, hydrogenation products of these polymers, and their mixtures. Among them, a norbornene polymer, and a polymer of a vinyl alicyclic hydrocarbon and a hydrogenation product thereof are preferable from the viewpoint of light transmission, heat stability, water absorption properties, and mechanical strength.

(1) Norbornene Polymer

The norbornene polymer that can be used in the present invention may include a ring-opening polymer of a norbornene monomer, a ring-opening copolymer of a norbornene monomer and at least one other monomer capable of being copolymerized with the norbornene monomer, a hydrogenation product of the polymer or copolymer, an addition polymer of a norbornene monomer, an addition copolymer of a norbornene monomer and at least one other monomer capable of being copolymerized with the norbornene monomer, etc. Among them, the hydrogenation product of the norbornene ring-opening polymer is the most preferable. Examples of the norbornene monomer may include bicyclo[2.2.1]-hept-2-ene, the popular name of which is norbornene, and its derivatives, those with substituents on their rings; tricyclo[4.3.0.1$^{2,5}$]dec-3,7-ene, the popular name of which is dicyclopentadiene, and its derivatives; 7,8-benzotricyclo[4.3.0.1$^{2,5}$]dec-3-ene, the popular name of which is methanotetrahydrofluorene and its derivatives; and tetracyclo[4.4.0.1$^{2,5}$.1$^{7,10}$]dodec-3-ene, the popular name of which is tetracyclododecene, and its derivatives. The substituents may include alkyl groups, alkylene groups, vinyl group, and alkoxycarbonyl groups. The norbornene monomer may include two or more of these substitutes. The norbornene monomer may be used singly or in combination. Ring-opening polymers of these norbornene monomers or ring-opening copolymers of these norbornene monomers and at least one other monomer capable of being copolymerized with the norbornene monomers may be obtained in the presence of a known ring-opening catalyst. Examples of the other monomer may include cycloolefin monomers with a single ring such as cyclohexene, cycloheptene, and cyclooctene.

The hydrogenation product of the ring-opening polymer of the norbornene monomers may be obtained typically by adding a known hydrogenation catalyst, which includes a transition metal such as nickel or palladium, to a solution for the polymerization of the ring-opening polymer, thereby hydrogenating the carbon-carbon unsaturated bonds. The addition polymer of the norbornene monomers or the addition copolymer of the norbornene monomers and the other monomers capable of being copolymerized with the norbornene monomers may be obtained by polymerizing these monomers in the presence of a known addition polymerization or copolymerization catalyst.

Examples of the other monomers capable of being copolymerized with the norbornene monomers may include α-olefins with 2 to 20 carbon atoms, such as ethylene, propylene, 1-butene, 1-pentene, 1-hexene, 1-octene, 1-decene, 1-dodecene, 1-tetradecene, 1-hexadecene, 1-octadecene, and 1-eicocene, and their derivatives; cycloolefins, such as cyclobutene, cyclopentane, cyclohexene, cyclooctene, and 3a,5,6,7a-tetrahydro-4,7-methano-1H-indene, and their derivatives; non-conjugated dienes, such as 1,4-hexadiene, 4-methyl-1,4-hexadiene, 5-methyl-1,4-hexadiene, and 1,7-octadiene. Among them, an α-olefin, especially ethylene is preferable.

The other monomers capable of being copolymerized with the norbornene monomers may be used singly or in combination. When the norbornene monomer and the other monomer are addition copolymerized, the weight ratio of the units originating from the norbornene monomer to the units originating from the other monomer should be from 30:70 to 99:1.

(2) Vinyl Aliphatic Hydrocarbon Polymer

Examples of the vinyl aliphatic hydrocarbon polymer may include polymers of vinyl aliphatic hydrocarbon monomers, such as vinylcyclohexene and vinylcyclohexane, and their hydrogenation products; and polymers of vinyl aromatic hydrocarbon monomers, such as styrene and α-methylstyrene, with their aromatic fragments being hydrogenated. Copolymers such as random or block copolymers of the vinyl aliphatic hydrocarbon monomers or vinyl aromatic hydrocarbon monomers with other monomers capable of being copolymerized with the hydrocarbon monomers may be included. There is no limitation on the block copolymers. Specific examples of the block copolymers may include multiblock copolymers such as diblock copolymers and triblock copolymers, and inclined block copolymers.

(3) Polymers of Cycloolefins with a Single Ring, and Polymers of Cyclic Conjugated Dienes The polymers of cycloolefins with a single ring may include addition polymers of cycloolefins with a single ring, such as cyclohexene, cycloheptene, and cyclooctene. The polymers of cyclic conjugated dienes may include polymers obtained by the 1,2- or 1,4-addition polymerization of cyclic conjugated dienes, such as cyclopentadiene and cyclohexadiene.

The molecular weight of the resin with an alicyclic structure appropriate for the present invention may suitably be selected depending on the purpose. The molecular weight may be measured by gel permeation chromatography using a cyclohexane solution or a toluene solution as mobile phase. The weight average molecular weight of the resin with an alicyclic structure is, in terms of polystyrene, typically from 5,000 to 500,000, preferably from 8,000 to 200,000, more preferably 10,000 to 100,000. The molecular weight within the range improves the mechanical strength of the resin and the molding and working properties thereof.

Although the glass transition temperature of the resin with an alicyclic structure appropriately employed in the present invention may suitably be selected depending on the purpose, the glass transition temperature should preferably from 80 to 350° C., more preferably from 130 to 250° C. The glass transition temperature within the range provides the resin with such good durability that the resin will have neither deformation nor stress concentration even under use at a high temperature.

The transparent substitute according to the present invention should have a water absorption of 0.1% or less, and a thermal expansion coefficient of 0 to 80 ppm/K. It is more preferable if the water absorption is 0.05% or less and the thermal expansion coefficient is from 0 to 70 ppm/K. The transparent substrate satisfying these requirements enables the electroluminescent element according to the present invention to hardly deteriorate in the properties due to deformation under normal conditions for use. When the water absorption is reduced, the water vapor permeation of the substrate is also reduced, which leads to the protection of the light-emitting layer that is apt to deteriorate in the presence of moisture. The transparent substrate with the water absorption and the thermal expansion coefficient within the ranges can easily be produced from the resin with the alicyclic structure described above. When the producing conditions are appropriately selected, the water absorption and the thermal expansion coefficient of the resin may further be decreased, which makes the resin desirable as material for the high-performance transparent substrate.

When the transparent substrate is made of a resin, a gas-barrier layer may be inserted between the transparent substrate and the first electrode layer. The gas-barrier layer is capable of protecting the light-emitting layer and the electrode layers from outside moisture. Materials for the gas-barrier layer may be $SiO_x$, $Al_2O_3$, $AlO_x$, $SiO_xN_y$, $SiN_x$, etc. The thickness of the gas-barrier layer is typically from 0.02 to 1 μm, preferably from 0.05 to 0.2 μm.

When the transparent substrate is made of a resin, the surface of the substrate that contacts the first electrode layer may be made functional. The word "functional" means to increase the surface energy of the transparent substrate by making the surface have functional groups with oxygen atoms or nitrogen atoms, thereby increasing the adhesion between the transparent substrate and the first electrode layer or gas-barrier layer that is layered on the substrate. The method for making the surface functional may include corona discharge treatment in an atmosphere of such a gas as oxygen, nitrogen, or argon; plasma discharge treatment; ion beam irradiation; electron beam irradiation; and ultraviolet irradiation.

The light-directional structure 5-1 will be explained hereinafter. A microlens array, or a structure made by arranging a plurality of microlenses in the transparent substrate 1, serves as light-directional structure 5-1. The microlens should be a substructure with a heightened portion and a lowered portion in relation to the surface of the transparent substrate, such as the shape of a hexagonal pyramid, a quadrangular pyramid, a triangular pyramid, a cone, a dome, a concave lens, or a convex lens. Furthermore, as shown in FIG. 1, the microlens preferably have a pyramidal or conical shape, such as a hexagonal pyramid, a quadrangular pyramid, a triangular pyramid, or a cone, and the microlenses each with a height of 0.01 to 100 μm are arranged along the long and short sides of the transparent substrate 1 at a pitch of 10 μm to 1 mm. The light-directional structure 5-1 should be such a structure that the reflection loss at the interface between the first electrode layer 2 and the transparent substrate 1 can be reduced when the light rays generated in the light-emitting layer 3 pass from the first electrode layer 2 to the transparent substrate 1. We are going to further explain the light-directional structure 5-1, referring to the example, which is an embodiment, shown in FIG. 1. In the surface of the transparent substrate 1 contacting the first electrode layer 2 are formed many microlenses 10, each in the shape of a quadrangular pyramid elevating upward from the first-electrode-layer-side surface of the transparent substrate 1, or with its apex directed to the inside of the transparent substrate. The microlenses 10, each with a height of 0.01 to 100 μm, form a microlens array arranged along the long and short sides of the transparent substrate 1 at a pitch of 10 μm to 1 mm.

Figure 3:
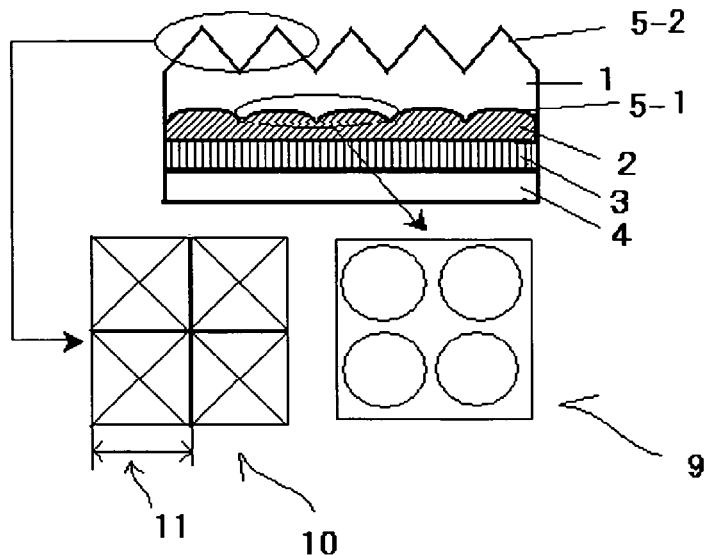
FIG. 3 is a diagram illustrating the structure of still another electroluminescent element according to the present invention, which is also described in Working Example 3. Shown in the lower part is an enlarged view of a part of the light-directional structure.

As shown in FIG. 3, cone-shaped microlenses may also be employed in the same way as the quadrangular pyramid-shaped microlenses. Specifically, the cone-shaped microlenses, each with a height of 0.01 to 100 μm, are arranged at a predetermined pitch, for example, from 10 μm to 1 mm, with their apices projecting upward. Each microlens is so formed that the bottom face of the cone constitutes the circumscribed circle of the frame, the side length of which corresponds to the arrangement pitch. The portions of the cone, on and near the bottom face, that project from the frame, in the direction of the long sides and that of the short sides of the substrate, are cut away, which prevents the adjacent microlenses from interrupting each other, and which does not allow the existence of a plane parallel with the surface, or a plate face of the transparent substrate, in the part comprised of the microlenses.

Although the aforementioned shapes have been described as examples of the microlens, the microlens may have other shapes or such shapes as those difficult to name as long as the microlens with the shapes has the function as we will explain below. Also, although the microlens array may have such a structure in which microlenses of the same shape are so arranged that the bottoms thereof form a plane without spaces between them, it is not an essential requirement. It will cause no problem if microlenses with various shapes, for example combinations of cone-shaped lenses and quadrangular pyramid-shaped microlenses, and with various sizes are arranged closely or sparsely. However, from the viewpoint of manufacturing and the function, microlens arrays, such as one composed of the same quadrangular pyramid-shaped microlenses arranged longitudinally and latitudinally, and consecutively without spaces in between, are preferable.

The function of the light-directional structure 5-1 will be explained. The explanation is made with reference to each microlens of the light-directional structure 5-1 in the surface of the transparent substrate 1 contacting the first electrode layer 2. The light rays generated in the electroluminescent light-emitting layer 3 are radial rays that go in all directions. Therefore the rays come, through the first electrode layer 2, into each microlens 9 of the light-directional structure 5-1 evenly from all directions. Because each microlens 9 is so formed to have the shape of, for example, a quadrangular pyramid with its apex held up, the loss resulting from the downward reflection of incidence rays is reduced and almost all of the incidence rays from all directions can be guided certainly to the transparent substrate 1. This mechanism improves the efficiency at which the light is sent to the transparent substrate 1.

Next, an improvement on another efficiency at which the light is out-coupled is explained. In order to out-couple the light from the transparent substrate 1 with a high refractive index to the air with a relatively low refractive index efficiently, it is necessary to reduce the reflection loss of the light, especially due to the total reflection, at the interface between the transparent substrate 1 and the air. The reduction can be achieved by making the rays, which come to the upper surface of the transparent substrate 1 from the light-emitting layer 3 through the first electrode layer 2, free from the total reflection at the surface of the transparent substrate 1, or by making the rays those with incidence angles not more than the critical angle of the total reflection. In other word, the reduction can be achieved by changing the non-oriented light rays generated in the light-emitting layer 3 to light rays directed upward, almost perpendicularly to the surface of the transparent substrate 1, with the light-directional structure 5-1. This change can be realized by utilizing the shape of the light-directional structure 5-1, and the difference between the refractive index of the transparent substrate 1 and that of the first electrode layer 2. Because the microlens structure, which is constituted by heightened portions and lowered portions, such as the quadrangular pyramids, has an ability to orient light rays when the light rays go through a high-refractive-index medium to a low-refractive-index medium, which makes smaller the incidence angle of the light rays in relation to the surface of the transparent substrate 1 that contacts the outside, the total reflection can be reduced. The microlenses are a preferable light-directional structure capable of directing the light rays upward. The microlens array that forms the light-directional structure 5-1 according to the present invention is preferably an array in which microlens-structured elements each with a height of 0.01 μm to 100 μm are arranged longitudinally and latitudinally at a pitch of 10 μm to 1 mm, more preferably those with a height of 1 μm to 100 μm at a pitch of 10 μm to 100 μm.

Figure 2:
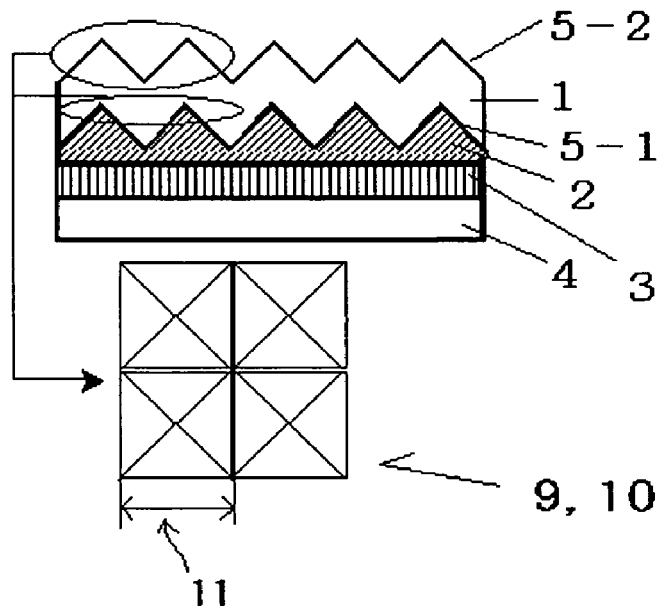
FIG. 2 is a diagram illustrating the structure of another electroluminescent element according to the present invention, which is also described in Working Example 2. Shown in the lower part is an enlarged view of a part of the light-directional structure.

If the light-directional structure 5-2 is also formed in the surface of the transparent substrate, which surface is the interface between the transparent substrate and the surrounding air, the first effect explained above can be obtained. The electroluminescent element shown in FIGS. 2 and 3 is an example of this embodiment. In this invention, the light-directional structures 5-1, 5-2, such as microlenses, formed in both surfaces of the transparent substrate have an effect of improving the light out-coupling efficiency. The structure can also reduce the total reflection at the upper surface of the transparent substrate by controlling the direction of the light at the interface between the transparent substitute and the surrounding air. Also for the light-directional structure 5-2, as well as for light-directional structure 5-1, is effective a microlens array constituted by many minute microlenses 10. Particularly preferable is a structure in which a plurality of microlenses each with a height of 0.01 to 100 μm are arranged along the long and short sides of the transparent substrate at a pitch of 10 μm to 1 mm.

There is no limitation on the method of producing the light-directional structure 5-1 and the microlens array in the upper surface of the transparent substrate 1, as long as the method can produce the microlens structure explained above. Examples of the method may include melt molding, injection molding, casting, embossing, electron-beam fine machining, roll forming, and inflation, all of which are common molding methods for resin.

Figure 4:
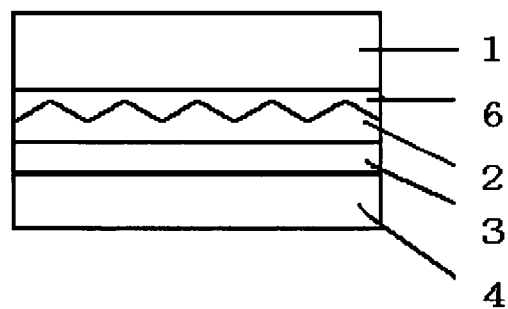
FIG. 4 shows an example of the electroluminescent element with a light-directional structure according to the present invention.
Figure 5:
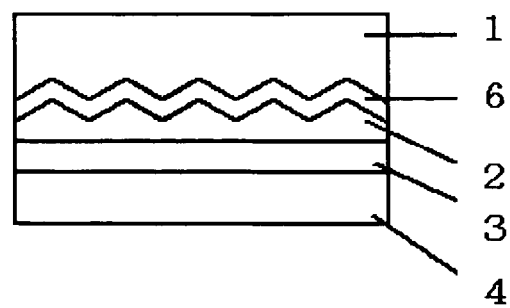
FIG. 5 shows another example of the electroluminescent element with another light-directional structure according to the present invention.

In the foregoing description, the light-directional structure 5-1 was explained as a shape of the surface of the transparent substrate 1. However, the light-directional structure 5-1 is not necessarily a part of the substrate. As shown in FIG. 4, a light-directional structure layer 6 may be made by sticking a film or sheet with the light-directional structure to the transparent substrate 1 with a smooth surface. In this case, the structure may be explained as that with the function of microlenses placed at the interface between the first electrode layer 2 and the light-directional structure layer 6. In other words, as shown in FIG. 4, the structure with the function may be obtained by inserting the light-directional structure layer 6 between the first electrode layer 2 and the transparent substrate 1. Furthermore, as shown in FIG. 5, the light-directional structure layer 6 may be stuck to the surface that has been provided with the light-directional structure, of the transparent substrate 1, so that a structure with a double-faced microlens array may be obtained. Also, the light-directional structure layer 6 is not necessarily a single layer; it may be a laminate or may work also as another functional layer such as a gas-barrier layer.

In the example of FIG. 4, the light-directional structure layer 6, as well as the transparent substrate, has to have optical transmission. On the other hand, the material of the layer 6 need not be the same as that of the transparent substrate 1. Very generally, the refractive index of the light-directional structure layer 6 should be the same as that of the first electrode layer 2 or transparent substrate 1, or between the refractive index of the first electrode layer 2 and that of the transparent substrate 1. The light-directional structure layer 6 may be made of a transparent inorganic material, such as glass, or a transparent resin. From the viewpoint of the ease of producing, resin materials are more appropriate. The structure layer may be made of the same material as the transparent substrate or the first electrode layer, and formed integrally with either of them. Specific examples of the resin material appropriate for the light-directional structure layer are those for the transparent substitute. Other examples may include chain polyolefins such as polyethylene and polypropylene; acrylic resins such as polyacrylic acid, poly(methyl acrylate), and polymethacrylic acid; polycarbonates; polystyrenes; poly(ether sulfide)s; poly(ethylene terephthalate)s; and poly(ethylene naphthalate)s.

Figure 6:
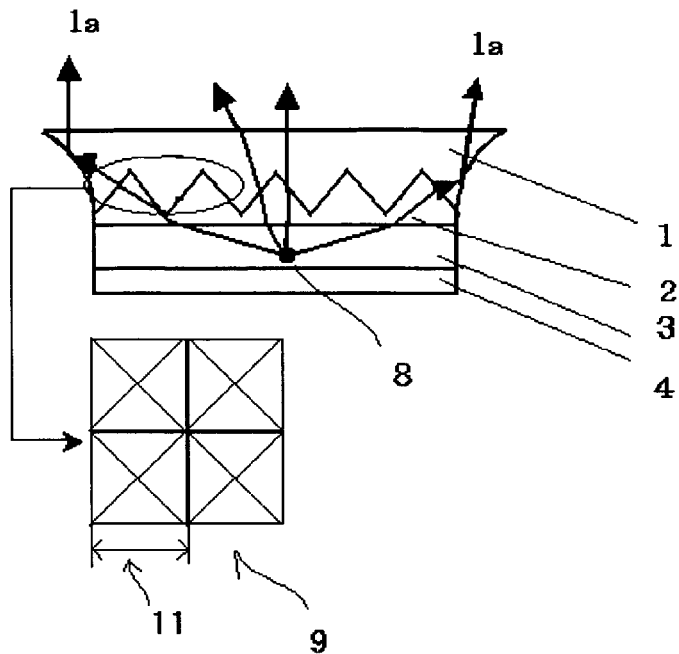
FIG. 6 is an illustration showing the section of the electroluminescent element of Working Example 4. An enlarged view of a part of the light-directional structure of the transparent substrate is also shown in the lower part.

In the present invention, the side faces of the transparent substrate should preferably be provided with a reflecting structure, as shown in FIG. 6. The electroluminescent element shown in FIG. 6 is composed of the transparent substrate 1, the first electrode layer 2, the light-emitting layer 3, and the second electrode layer 4, layered in this order from the top to the bottom. Upon the application of a voltage supplied by a power source, which is not shown in the figure, between the first electrode layer 2 and the second electrode layer 4, the light-emitting layer 3 generates light by the electroluminescent effect and the generated light passes through the transparent first electrode layer 2 and the transparent substrate 1, exits the electroluminescent element, and goes upward. Then, various lightening equipment and display devices utilizing the light can be provided.

In FIG. 6, the reflecting structure so functions as to make the light rays that leaked out of the electroluminescent element through the side faces of the transparent substrate 1 reflect off the side faces and directed to the inside of the transparent substrate 1. The side faces of the reflecting structure have, for example, such a shape that a vertical section of each side face gradually bends outward with the height, as shown in FIG. 6. In this example, the amount of the light rays that are directed to the side faces and re-directed to the inside of the transparent substrate 1 by the total reflection at the side faces is increased. In other words, this special side structure of FIG. 6 enlarges the angles of incidence at which the light rays that have been emitted by the light source 8 go into the side faces, and these large angles of incidence enable the light rays to totally reflect off the side faces and return to the inside of the transparent substrate 1. Thus the light rays, advancing upward from the upper surface of the transparent substrate 1, are efficiently utilized. Generally, when light passes from a first medium with a first refractive index to a second medium with a second refractive index that is smaller than the first refractive index, the light rays going into the second medium at incidence angles larger than the critical angle of the total reflection are totally reflected at the interface. The critical angle of the total reflection $\theta_c$ is expressed by the formula: $\sin^{-1}(n_L/n_H)$, wherein $n_H$ denotes the refractive index of the first medium with a higher refractive index, or that of the transparent substrate; $n_L$ the refractive index of the second medium with a lower refractive index, or that of the air; and $\theta_c$ the critical angle of the total reflection, as defined above.

This embodiment utilizes this character of light. In the example of FIG. 6, the light rays from the light source 8 are totally reflected, and the reflected light rays 1a are directed upward and emitted from the element. There is no special requisite for the reflecting structure, other than the function that prevents the side faces from transmitting the light rays from the light-emitting layer 3, which is located below the transparent substrate 1, and reflects the light rays toward the upper surface of the transparent substrate. A specific example of the reflecting structure may be such that the side faces have such a shape that a vertical section of each side face gradually bends outward as the height increases, as shown in FIG. 6.

Figure 7:
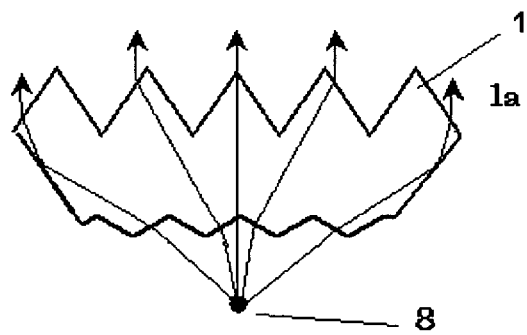
FIG. 7 is a schematic illustration showing an example of the transparent substrate, the side faces of which have a reflecting structure in the shape of a slope.
Figure 8:
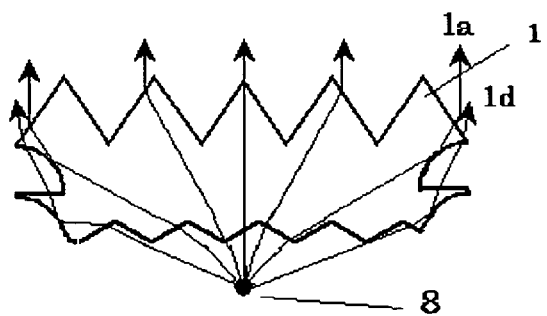
FIG. 8 is a schematic illustration showing another example of the transparent substrate, the side faces of which have a reflecting structure with projecting portions and depressed portions.

Another example of the reflecting structure according to the present invention is provided by the side faces that are so inclined that the vertical section of the substrate is in the shape of a general trapezoid with its longer base held up, as shown in FIG. 7. Although the heightened and lowered portions in the upper surface of the transparent substrate 1 are exaggerated in FIG. 7, the portions are so small that the actual appearance of the upper surface is almost smooth. In this example, only one side of the trapezoid may be inclined. However, preferable is a trapezoid with both sides inclined so that they go away from each with the height from the bottom of the substrate, as shown in FIG. 7, to make the incidence angles of the light rays larger. More preferable is that all of the four side faces employ the shape of the trapezoid with both sides inclined in the same way. As shown in FIG. 8, another example of the reflecting structure is one in the shape made by stacking up a plurality of the transparent substrates with their side faces gradually bending outward with the height. Needless to say, the structure in the shape made by stacking up a plurality of the transparent substrates in the shape of the above-mentioned trapezoid works as well. The latter examples have the same effect of preventing the transmission loss due to the leak from the side faces, as the former examples. The advantage of the latter examples is that the size of the upper surface of the transparent substrate 1 is made almost equal to that of the bottom surface thereof, which is desirable from the viewpoint of manufacturing and handing. In FIG. 8, the rightmost light ray from the light source 8 is, first, totally reflected by the side face, and directed upward. The light ray once goes out of the transparent substrate. However, since the light ray is directed nearly upward, it immediately re-enters the transparent substrate at the part just above the part from which the ray went out. Finally, it goes out of the element from the upper surface as light ray 1d, which will be utilized. This example of the present invention can easily be carried out by forming grooves parallel with the surfaces of the transparent substrate and in the shape of either of the latter embodiments, in the side faces.

The reflecting structure according to the present invention may also be obtained by forming projecting portions and depressed portions in the side faces of the transparent substrate. The aforementioned embodiments of the structure are also a kind of structure with projecting portions and depressed portions. The embodiments in this paragraph may be obtained by forming projecting and depressed portions, each unit of the portions being in the shape of, for example, a quadrangular pyramid, a triangular pyramid, a hexagonal pyramid, a cone, or a dome. When a pyramid, such as a quadrangular pyramid, is employed as a unit forming the projecting and depressed portions, the axis from the apex to the bottom face thereof and perpendicular to the bottom face should preferably be so inclined that the axis is at a higher level on the side of the apex. It is because the inclination provides such a structure that the light rays, from the light-emitting layer, of incidence on the side faces are easily reflected.

Figure 9:
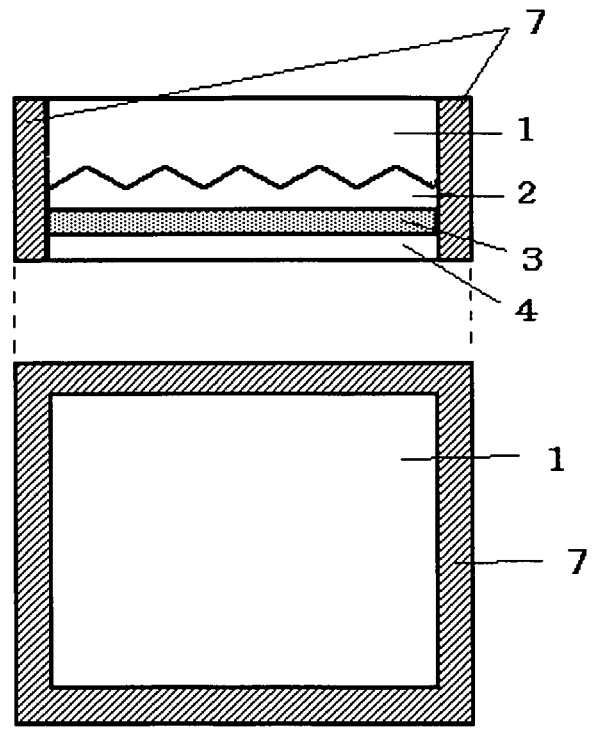
FIG. 9 is a diagram illustrating the structure of the electroluminescent element, the side faces of which are provided with mirror surfaces, prepared in Working Example 5. A top view of the same structure is also shown in the lower part.

Still another example of the structure capable of functioning as the reflecting structure according to the present invention is the side faces made of a mirror, as shown in FIG. 9. If a lustrous substance 7, such as metal, is applied to the side faces of the transparent substrate 1 and the side faces are made a mirror surface, almost all of the light rays, generated in the light-emitting layer, of incidence on the side faces are reflected and returned to the inside of the transparent substrate, which makes it possible to effectively utilize the generated light rays. Specific methods of preparing mirror side faces include, for example, forming a metal film on the side faces and covering the side faces with plates each with a mirror. If part of the side faces of the transparent substrate 1 is provided with such a reflecting structure, the structure should be effective. However, from the viewpoint of improving the efficiency at which the light is out-coupled from the electroluminescent element, all of the four side faces should be provided with a reflecting structure. In a more preferable embodiment according to the present invention, the bottom face of the electroluminescent element, or the second electrode layer 4 per se has a mirror function. Otherwise, the bottom face of the second electrode layer 4 may be provided with a mirror surface. Thus, the light out-coupling efficiency is further improved. An example of this embodiment is a second electrode layer 4 made of a lustrous metal, such as aluminum.

Now, returning to FIG. 1, we are going to explain the first electrode layer 2. Ordinary transparent electrodes for electroluminescent elements may be used for the first electrode layer 2. However, the first electrode layer 2 has to have adhesion to and affinity for the transparent substrate 1. Because the light-directional structure 1 of the surface of the transparent substrate 1 is not smooth, the first electrode layer 2 and the transparent substrate 1 have to be carefully joined so that they stick fast to each other. A typical example of the transparent electrode may be obtained by sputtering indium zinc oxide, which is often called "IZO", or indium tin oxide, which is often called "ITO", to the surface of the transparent substrate. When the first electrode layer 2 is formed by deposition on the surface of the light-directional structure 5-1, or under the light-directional structure 5-1 as shown in FIG. 1, the interface between the first electrode layer 2 and the light-emitting layer 3 may have a face with heightened portions and lowered portions similar to those of the light-directional structure 5-1 if the thickness of the first electrode layer 2 is smaller than the distance between the top of the heightened portion and the bottom of the lowered portion of the light-directional structure 5-1. However, this rough interface does not mar the advantages of the present invention. The thickness of the first electrode layer 2 is typically from 0.01 to 1 µm, preferably from 0.1 to 5 µm.

The part of the element lower than the first electrode layer 2 may have the same structure as the corresponding part of ordinary electroluminescent element. Specifically, the first electrode layer 2, the light-emitting layer 3, and the second electrode layer 4 are layered in this order on the lower surface of the transparent substrate 1. The light-emitting layer 3 may be comprised of a laminate made of an allylamine material such as TPD and an aluminum complex such as Alq$_3$, or a laminate of a single layer or a plurality of layers made of an inorganic material such as ZnS and an organic material such as Alq$_3$. The thickness of the light-emitting layer 3 is typically from 0.01 to 2 µm, preferably from 0.1 to 0.5 µm. The second electrode layer 4 may sometimes have a function of reflecting the generated light rays to the transparent substrate. The second electrode layer 4 is sometimes called "back side electrode" and made of, for example an evaporated film of aluminum. The thickness of the second electrode layer is typically from 0.01 to 1 µm, preferably from 0.1 to 0.5 µm. Upon the application of a voltage between the first electrode layer 2 and the second electrode layer 4, the light-emitting layer 3 generates light by electroluminescent effect. The generated light, as well as the light reflected by the second electrode layer 4, passes through the first electrode layer 2, the light-directional structure 5 and the transparent substrate 1, and goes outside the electroluminescent element. The electroluminescent element according to the present invention may comprise layers other than the transparent substrate, the first electrode layer, the light-emitting layer, and the second electrode layer. The other layers may include a hole-injecting layer, a hole-transporting layer, an electron-transporting layer, an electron-injecting layer, and a sealing layer. Materials for these layers may be those known for the layers of conventional electroluminescent elements.

The embodiment of the electroluminescent element according to the present invention is structured, for example as shown in FIG. 1. When a predetermined driving voltage, supplied from a driving power source that is not shown in the figure, is applied between the first electrode layer 2 and the second electrode layer 4, the light-emitting layer 3 generates light by electroluminescent effect, and the generated light passes through the first electrode layer 2, the light-directional structure 5 and the transparent substrate 1 and goes outside the electroluminescent element. The light out-coupled from the element has high luminance, and the light can be utilized for various lightening equipment. It may also be used for display devices, and there is a probability that it may lead to the development of various desirable display devices that may replace liquid-crystal display devices. Furthermore, the electroluminescent element according to the present invention also has functions suitable for backlight devices for liquid-crystal displays, and the element, combined with a liquid-crystal display, can provide an advantageous display device.

EXAMPLES

Working Example 1

An electroluminescent element with the constitution shown in FIG. 1 was prepared. The embodiment shown in FIG. 1 has a transparent substrate 1 provided with a light-directional structure 5-1, and a first electrode layer 2, a light-emitting layer 3 and a second electrode layer 4, which layers are layered on the surface with the light-directional structure 5-1, of the transparent substrate 1one by one in this order. The bottom surface of the transparent substrate 1 is the light-directional structure comprised of an array of quadrangular pyramid-shaped microlenses arranged longitudinally and latitudinally in the surface of the transparent substrate. The material employed for the transparent substrate 1 was a norbornene resin with a refraction index of 1.5, a water absorption of 0.05%, and a thermal expansion coefficient of 70 ppm/K. The dimensions of the transparent substrate 1 were 40 mm in width, 40 mm in length, and 1 mm in thickness. Each microlens was in the shape of a quadrangular pyramid with its apex held upward and with a base of 50 µm and a height of 25 µm. The 50-µm base corresponded to the arrangement pitch, though not shown in the figure. The transparent substrate 1 with the microlens array was prepared by injection molding. The first electrode layer 2 was so deposited on the substrate by DC sputtering indium zinc oxide with a refraction index (n) of 2 that the thickness of the deposit film was 200 nm. For the light-emitting layer 3 was employed a laminate of TPD, which is an allylamine material, and $Alq_3$, an aluminum complex. The laminate was so prepared by vacuum deposition that the thickness of the obtained film was about 100 nm. The second electrode layer 4 was also so deposited by vacuum deposition that the thickness of the deposit film was 100 nm. The prepared electroluminescent element was made to emit light by applying a voltage of 5 V between the first electrode layer 2 and the second electrode layer 4. The luminance of the light emitted in the front direction from the surface of the electroluminescent element was measured with a luminance meter produced by Prometric. The results of the measurement are shown in Table 1. The light out-coupling efficiency is expressed by the rate compared with the efficiency of Comparative Example 1. As the value of the efficiency becomes greater, the element is more desirable.

Working Example 2

An electroluminescent element with the transparent substrate of the structure shown in FIG. 2, in place of the transparent substrate 1 of Working Example 1, was prepared. The electroluminescent element of Working Example 2 had the transparent substrate, the upper surface of which was not smooth but with the microlens array 5-2 that was the same as the microlens array of the lower surface. Each microlens in the upper surface was in the shape of a quadrangular pyramid with its apex held upward and with a base of 50 µm and a height of 25 µm. The 50-µm base corresponded to the arrangement pitch 11. The constructions and preparation methods of the other parts were the same as those employed in Working Example 1. The light out-coupling efficiency was measured in the same way. The results are also shown in Table 1.

Working Example 3

An electroluminescent element with the transparent substrate of the structure shown in FIG. 3, in place of the transparent substrate 1 of Working Example 2, was prepared. The electroluminescent element of Working Example 3 had the light-directional structure 5-1, which was layered between the transparent substrate 1 and the first electrode layer 2, with an array of concave lenses, in place of the quadrangular pyramid-shaped lenses, each of which had almost the same size of each of the quadrangular pyramids. Specifically, the concave lenses, each with the inward convex dome, the height of which was 20 µm, were arranged at a pitch 11 of 50 µm. The constructions and preparation methods of the other parts were the same as those employed in Working Example 2. The light out-coupling efficiency was measured in the same way. The results are also shown in Table 1.

Working Example 4

An electroluminescent element with the transparent substrate of the structure shown in FIG. 6, in place of the transparent substrate 1 of Working Example 1, was prepared. The electroluminescent element of Working Example 4 had the transparent substrate, the four side faces of which had such a shape that a vertical section of each side face gradually bends outward with the height, describing a circular arc with a radius of curvature of about 20 mm, whereby the side faces formed the shape of a trumpet. The constructions and preparation methods of the other parts were the same as those employed in Working Example 1. The light out-coupling efficiency was measured in the same way. The results are also shown in Table 1.

Working Example 5

An electroluminescent element with the transparent substrate of the structure shown in FIG. 9, in place of the transparent substrate 1 of Working Example 1, was prepared. The electroluminescent element of Working Example 5 had the transparent substrate 1, the four side faces of which were provided with a lustrous aluminum foil 7 having a thickness of 0.2 mm, whereby the side faces were provided with a mirror surface. The constructions and preparation methods of the other parts were the same as those employed in Working Example 1. The light out-coupling efficiency was measured in the same way. The results are also shown in Table 1.

Comparative Example 1

Figure 11:
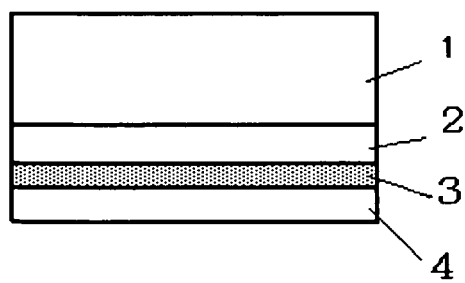
FIG. 11 is a diagram illustrating the structure of the electroluminescent element prepared in Comparative Example 1.

An electroluminescent element with the transparent substrate of the structure shown in FIG. 11, in place of the transparent substrate 1 of Working Example 1, was prepared. The electroluminescent element of Comparative Example 1 had the transparent substrate, the bottom surface of which was not comprised of an array of quadrangular pyramid-shaped microlenses, but smooth. The constructions and preparation methods of the other parts were the same as those employed in Working Example 1. In other words, the electroluminescent element of Comparative Example 1 had a conventional structure. The light out-coupling efficiency was measured in the same way. The results are also shown in Table 1.

Comparative Example 2

Figure 10:
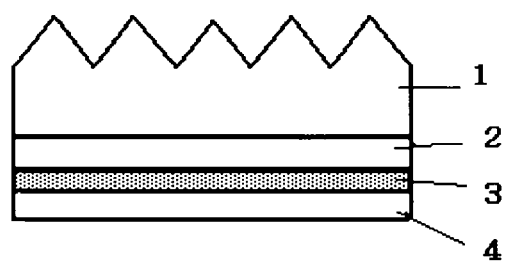
FIG. 10 is a diagram illustrating the structure of the electroluminescent element prepared in Comparative Example 2.

An electroluminescent element with the transparent substrate of the structure shown in FIG. 10, in place of the transparent substrate 1 of Working Example 2, was prepared. The electroluminescent element of Comparative Example 2 did not have a light-directional structure 5-1 between the transparent substrate 1 and the first electrode layer 2; the interface was just smooth. The constructions and preparation methods of the other parts were the same as those employed in Working Example 2. The light out-coupling efficiency was measured in the same way. The results are also shown in Table 1.

TABLE 1

| Evaluated Items | Luminance (cd/m$^2$) | Light Out-coupling Efficiency |
| --- | --- | --- |
| Working Example 1 | 230 | 2.3 |
| Working Example 2 | 280 | 2.8 |
| Working Example 3 | 280 | 2.8 |
| Working Example 4 | 270 | 2.7 |
| Working Example 5 | 280 | 2.8 |
| Comparative Example 1 | 100 | 1.0 |
| Comparative Example 2 | 150 | 1.5 |

From the results summarized in Table 1 are understood the followings: The electroluminescent element according to the present invention emits light at high luminance, and the emitted light is out-coupled from the element at high efficiency, as Working Examples 1-5 show. On the other hand, the electroluminescent elements in the comparative examples are inferior in the luminance and the efficiency.

INDUSTRIAL APPLICABILITY

The electroluminescent element according to the present invention is suitably used for various lightening devices and display devices with high luminance, because the element has an improved light out-coupling efficiency by providing the light rays with a directional control. Also, when the element is used as the backlight device of a liquid-crystal display device, it can easily improve the brightness and reduce the electric power consumption of the display. Furthermore, it can be utilized for lightening equipment or displays that require a directional orientation of the light.

We claim:

1. An electroluminescent element comprising a transparent substrate, and a first electrode layer, a light-emitting layer, and a second electrode layer, which layers are deposited on the substrate in this order, wherein a surface of the transparent substrate on the side of the first electrode layer has a light-directional structure, wherein the first electrode layer is prepared by deposition on the surface of the light-directional structure, wherein the light-directional structure comprises a microlens array, wherein the transparent substrate is a plate in the shape of a square or a rectangle, wherein the transparent substrate has the light-directional structure in both surfaces thereof, one of which is the surface of the transparent substrate directly contacting the first electrode layer and has a smaller refractive index than a refractive index of the first electrode layer, and another of which is the interface between the transparent substrate and the surrounding air, and wherein the microlens array comprises a plurality of microlenses, each with a height of 0.01 to 100 μm, arranged throughout the length and breadth of the transparent substrate at a pitch of 10 μm to 1 mm.

2. The electroluminescent element according to claim 1, wherein the transparent substrate comprises side faces orthogonal to the surface of the planar substrate, wherein said side faces are provided with a reflecting structure.

3. The electroluminescent element according to claim 2, wherein the reflecting structure comprises projecting portions and depressed portions.

4. The electroluminescent element according to claim 2, wherein the reflecting structure comprises a mirror surface.

5. The electroluminescent element according to claim 1, wherein the transparent substrate has a water absorption of 0.1% or less and a thermal expansion coefficient of 0 to 80 ppm/K.

6. The electroluminescent element according to claim 1, wherein the transparent substrate is made of a resin with an alicyclic structure.

7. A lightening device comprises the electroluminescent element according to claim 1.

8. A display device comprises the electroluminescent element according to claim 1.

9. The electroluminescent element according to claim 1, wherein the light-directional structure is a structure comprising many arranged conical lenses, polygonal pyramid-shaped lenses, or domed lenses.

10. The electroluminescent element according to claim 1, wherein the light-directional structure is formed as a shape of the surface of the transparent substrate.

11. The electroluminescent element according to claim 1, wherein the light-directional structure is a light-directional structure layer comprising a film or a sheet, wherein the light-directional structure layer is inserted between the first electrode layer and the transparent substrate.

12. The electroluminescent element according to claim 1, wherein a light generated in the light-emitting layer, as well as the light reflected by the second electrode layer, passes through the first electrode layer, the light-directional structure and the transparent substrate, and goes outside the electroluminescent element.

13. The electroluminescent element according to claim 1, wherein the light-directional structure in the surface of the transparent substrate which is the interface between the transparent substrate and the surrounding air, has a pyramidal or conical shape whose apex is directed to the outside of the transparent substrate.

14. The electroluminescent element according to claim 1, wherein the light directional structure in the surface of the transparent substrate directly contacting the first electrode layer comprises a plurality of microlenses each projecting into the transparent substrate.

* * * * *